United States Patent
Gilliland

(10) Patent No.: US 8,519,665 B2
(45) Date of Patent: Aug. 27, 2013

(54) ADJUSTABLE EMI SUPPRESSION CORE FOR COMMON MODE/NORMAL MODE BALANCE

(75) Inventor: Don Alan Gilliland, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 935 days.

(21) Appl. No.: 12/631,129

(22) Filed: Dec. 4, 2009

(65) Prior Publication Data
US 2011/0133737 A1    Jun. 9, 2011

(51) Int. Cl.
*H02J 7/00* (2006.01)
*H01F 27/24* (2006.01)

(52) U.S. Cl.
USPC .......................................... 320/108; 336/212

(58) Field of Classification Search
USPC ................. 333/12, 181–185; 336/83, 92, 98, 336/174, 175, 176, 212
See application file for complete search history.

(56) References Cited

U.S. PATENT DOCUMENTS

| | | | | |
|---|---|---|---|---|
| 3,187,284 A | * | 6/1965 | Herre et al. | 336/135 |
| 4,523,170 A | * | 6/1985 | Huth, III | 336/83 |
| 5,764,125 A | * | 6/1998 | May | 336/92 |
| 2008/0303624 A1 | * | 12/2008 | Yamada et al. | 336/212 |

* cited by examiner

*Primary Examiner* — Melissa Koval
*Assistant Examiner* — Daniel Miller
(74) *Attorney, Agent, or Firm* — Robert R. Williams

(57) ABSTRACT

An adjustable EMI suppression core has an outer core having a first reluctance. The outer core has three apertures aligned horizontally. A first aperture and a third aperture are each suitable for a wire to be placed therein. A second aperture is located between the first and third apertures. An inner core is rotatable engaged in the second aperture, for example, using matching threads on an inner surface of the second aperture and an outer surface on the inner core. The inner core has first and third portions having a second reluctance similar to the first reluctance and a third portion having a reluctance considerably higher than the first and second reluctances. Rotating the inner core varies a normal mode and a common mode suppression of currents in the wires placed in the first and second apertures.

12 Claims, 8 Drawing Sheets

ADJUSTABLE EMI SUPPRESSION CORE FOR COMMON MODE/NORMAL MODE BALANCE

FIELD OF THE INVENTION

This invention relates generally to electromagnetic compatibility (EMC), and more specifically to electromagnetic interference (EMI) suppression cores.

SUMMARY OF EMBODIMENTS OF THE INVENTION

An adjustable EMI suppression core comprises an outer core and an inner core. The outer core further comprises three horizontally aligned apertures. The inner core is rotatably engagable within the second aperture. The outer core has a first reluctance. The inner core comprises three sections. The first and third sections of the inner core have a second reluctance similar to that of the outer core. The second section of the inner core has a third reluctance much greater than the first and second reluctances.

The inner core may comprise a means of rotation with a tool adapter such as a key slot. A further embodiment of the adjustable EMI suppression core comprises threads on the exterior of the inner core and threads on the interior of the second aperture. Another embodiment of the adjustable EMI suppression core comprises a plastic case to enclose the outer core for protection.

Additional embodiments of the outer core comprise dividing the outer core into two portions. The two portions may be separated and later mechanically joined; for example, the two portions of the outer core may further comprise a hinge and a latch mechanism on opposite ends as a means of opening, closing, and locking the two outer core portions together. A separate embodiment comprises a latch mechanism at each end.

BRIEF DESCRIPTION OF THE DRAWINGS

FIG. 1A shows the adjustable EMI suppression core comprised of an outer core, an inner core, a first aperture, a second aperture, and a third aperture. A first wire is shown inserted into the first aperture. A second wire is shown inserted into the third aperture.

FIG. 4A shows the inner core in Common Mode Position.

FIG. 6 shows an exemplary distance the inner core is rotatably engaged in the outer core.

DETAILED DESCRIPTION OF THE EMBODIMENTS

In the following detailed description of embodiments of the invention, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

Embodiments of the present invention provide for an apparatus for adjustable common mode/normal mode balance in emission suppression, shown completed in the figures.

When a signal travels through a conductor, a magnetic field is generated around that conductor. A ferrite core, having a relatively low reluctance, if placed around the conductor, can interact with this magnetic field. The magnetic field activates (permeates) the ferrite, which, in response to the magnetic field, imposes impedance that reduces a magnitude of EMI associated with the currents in wires passing through the ferrite core.

Figure 1A:
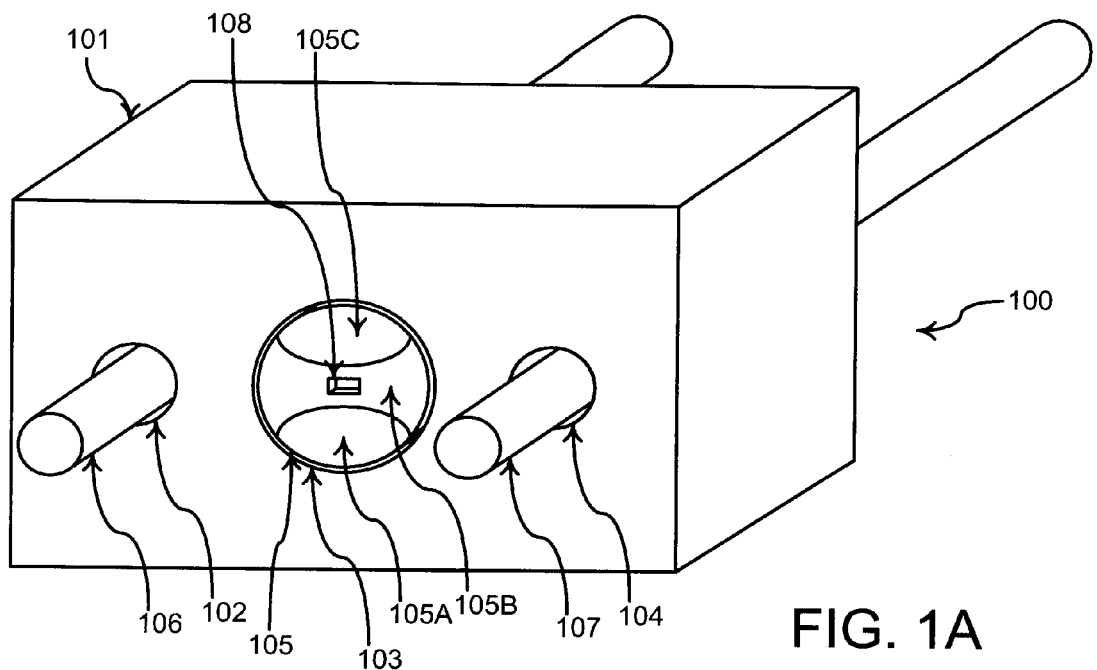
FIG. 1A is a three-dimensional view of an adjustable EMI suppression core.
Figure 1B:
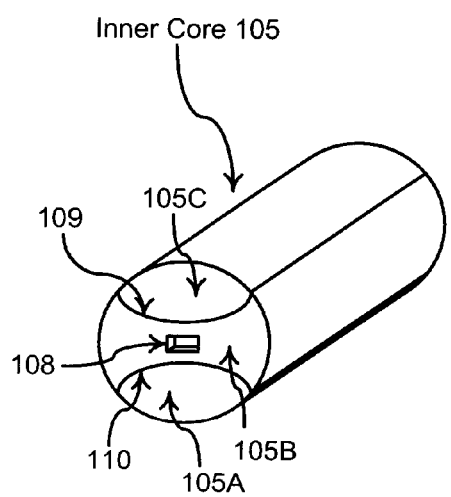
FIG. 1B is a three-dimensional view of the inner core comprised of three sections and a means for rotating.

Referring to FIG. 1A and FIG. 1B, FIG. 1A shows a three dimensional view of an adjustable EMI suppression core 100. Adjustable EMI suppression core 100 comprises an outer core 101 and an inner core 105 (shown in more detail in FIG. 1B).

The outer core 101 has a first reluctance. The outer core 101 also has a first aperture 102; a second aperture 103; and a third aperture 104. First aperture 102, second aperture 103, and third aperture 104 are arranged horizontally in sequence as shown in FIG. 1A. The first and third apertures are each suitable for a wire, shown as wire 106 and wire 107, to pass through.

The diameters of aperture 102 and aperture 104 should be advantageously equal to the diameters of corresponding wire 106 and wire 107. As the diameters of aperture 102 and aperture 104 get larger than the corresponding diameters of wire 106 and wire 107, sensitivity to normal mode/common mode control decreases. One embodiment of this invention has the diameters of aperture 102 and aperture 104 equal to 105% of the diameters of corresponding wire 106 and wire 107. A second embodiment has the diameters of aperture 102 and aperture 104 equal to 110% of the diameters of corresponding wire 106 and wire 107. Additionally, aperture 102 and aperture 104 should be advantageously placed close to aperture 103. As aperture 102 and aperture 104 are placed farther away from aperture 103, control sensitivity of normal mode/common mode decreases. One embodiment of this invention has aperture 102 and aperture 104 at a distance from the nearest point of aperture 103 less than the diameters of apertures 102 and 104.

FIG. 1B shows a three dimensional view of inner core 105. Inner core 105 comprises a first section 105A having a second reluctance; a second section 105B having a third reluctance; and a third section 105C having the second reluctance. Sections 105A, 105B, and 105C are also shown in FIG. 1A. The shape of inner core 105 is generally cylindrical. Exemplary shapes of sections 105A, 105B, and 105C are shown in FIG. 1A. Deviations from the depicted shapes of sections 105A, 105B, and 105C are contemplated. For example, whereas the shapes of sections 105A and 105C are shown to be curved on boundaries 109 and 110 (FIG. 1B) with section 105B, the boundaries 109 and 110 could be straight or less convex than shown and still be within the scope and spirit of the invention.

The inner core 105 is rotatably engagable in the second aperture 103 of the outer core 101. Tool adapter 108, shown in FIGS. 1A and 1B, allows for insertion of a tool, such as a screwdriver blade, for rotation of inner core 105.

Inner core sections 105A and 105C have a second reluctance similar to the reluctance of the outer core 101. Inner core section 105B has a third reluctance. The second reluctance of inner core sections 105A and 105C may for example be less than or equal to twice the first reluctance of outer core 101. The greater the second reluctance is relative to the first reluctance, the common mode/normal mode control sensitivity decreases. In an embodiment the second reluctance is equal to or less than the first reluctance. Additionally, the third reluctance of inner core section 105B may for example be at least five times greater than the first and the second reluctance. The closer the third reluctance is relative to the first and second reluctance, the common mode/normal mode control sensitivity decreases.

Figure 2:
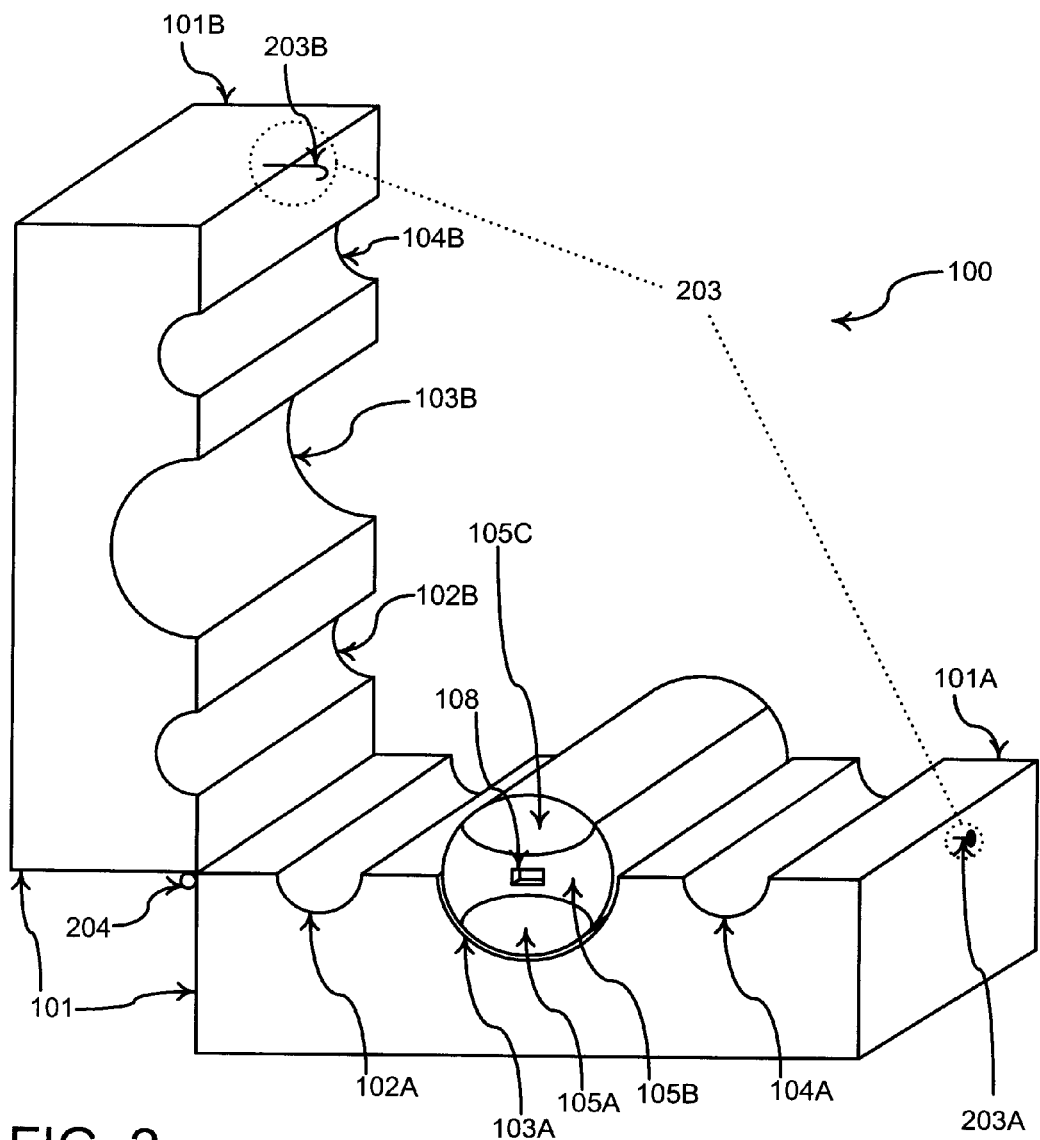
FIG. 2 is a three-dimensional view of the adjustable EMI suppression core divided into two portions attached at one end with a hinge and the other end fitted with a hook and latch mechanism.

FIG. 2 shows a three-dimensional view of an embodiment of adjustable EMI suppression core 100 wherein outer core 101 is separable into two parts to facilitate insertion of wires 106 and 107. In this embodiment, outer core 101 is comprised of two parts, 101A and 101B. Aperture 102 of FIG. 1 is shown as aperture portions 102A and 102B in FIG. 2. Aperture 103 of FIG. 1 is shown as aperture portions 103A and 103B in FIG. 2. Aperture 104 of FIG. 1 is shown as aperture portions 104A and 104B in FIG. 2.

The embodiment of the adjustable EMI suppression core in FIG. 2 comprises the hinging of outer core part 101A to outer core part 101B with hinge 204 as shown in FIG. 2. This allows the outer core 101 to open and outer core parts 101A and 101B to separate. The separation of outer core parts 101A and 101B allows for wires 106 and 107 to be placed in aperture portions 102A and 104A followed by the closing of outer core parts 101A and 101B. Also, the separation of outer core parts 101A and 101B allows for the inner core 105 to be placed in either aperture portion 103A or 103B followed by the closing of outer core parts 101A and 101B.

The embodiment in FIG. 2 further comprises the ability to lock outer core part 101A to outer core part 101B with lock 203 at the opposite end of outer core 101 from hinge 204. An example embodiment of lock 203 comprises a hook 203B and a pin 203A. Hook 203B goes around pin 203A and locks outer core part 101A to outer core part 101B to prevent them from separating. Unhooking hook 203B from around pin 203A unlocks outer core part 101A from outer core part 101B and allows them to separate. Whereas a hook and a pin are shown as an exemplary means to maintain the assembly, any suitable securing means may be used to maintain the assembly.

In an alternative embodiment not shown, a lock such as lock 203 above is used on each end of outer core 101 removing the requirement for hinge 204.

Figure 3:
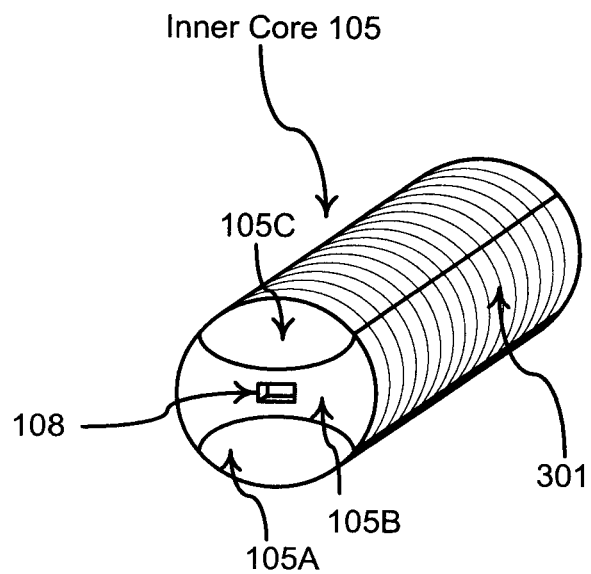
FIG. 3 is a three-dimensional view of the inner core further comprising threads.

FIG. 3 shows a further embodiment of inner core 105 comprising the addition of threads 301. Matching threads are formed along the inside of aperture 103. Threads 301 enable inner core 105 to be rotatably engaged in aperture 103 of outer core 101. This embodiment allows control of how deeply inner core 105 is engaged within aperture 103 of outer core 101.

Figure 4A:
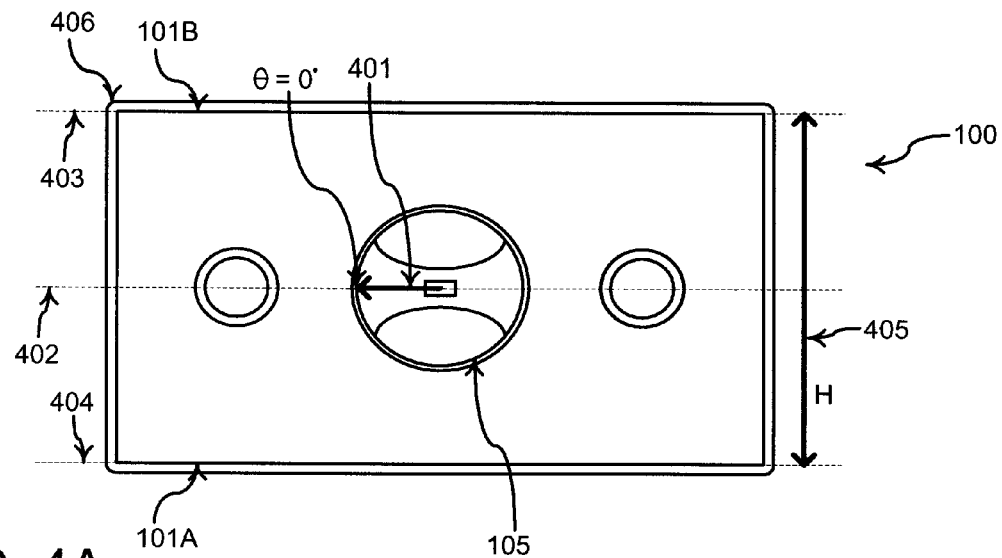
FIG. 4A is an end view of the adjustable EMI suppression core further comprising a plastic shell.
Figure 4B:
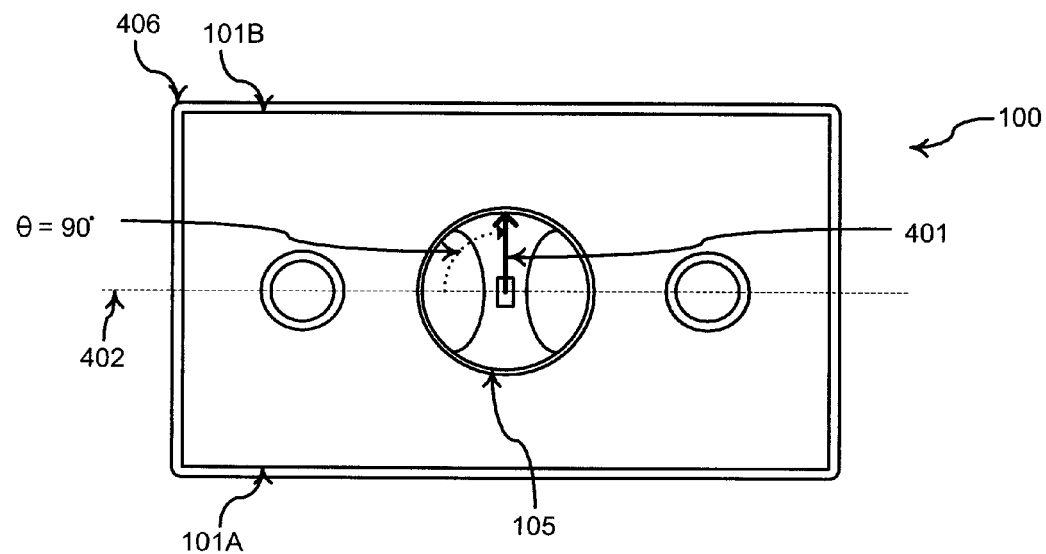
FIG. 4B is an end view of the adjustable EMI suppression core with the inner core in Normal Mode Position.

FIG. 4A and FIG. 4B portray end views of adjustable EMI suppression core 100. Outer core 101 is shown with the two halves, 101A and 101B, closed. The entire adjustable EMI suppression core 100 further comprises a plastic case 406 to enclose outer core 101. Typically, the material of which outer core 101 is composed is brittle. Common examples of core materials include Material 43 or Material 61 from Fair-Rite Products Corporation, P.O. Box J, One Commercial Row, Wallkill, N.Y. 12589-0288. Thus, plastic case 406 contains and protects outer core 101 in adjustable EMI suppression core 100. An embodiment comprising plastic case 406 removes the need for hinge 204 (FIG. 2) and lock 203 (FIG. 2).

In FIGS. 4A and 4B, rotation vector 401 is not a physical embodiment. Rotation vector 401 represents the degrees of turn of inner core 105 with respect to axis 402, also a non-physical embodiment. FIG. 4A shows inner core 105 rotated zero degrees with respect to axis 402. This position of inner core 105 is known as "Common Mode Position". FIG. 4B shows inner core 105 rotated ninety degrees with respect to axis 402. This position of inner core 105 is known as "Normal Mode Position".

Outer core 101 comprises a top surface 403 and a bottom surface 404. Outer core 101 has a height H 405 between top surface 403 and bottom surface 404.

Figure 5A:
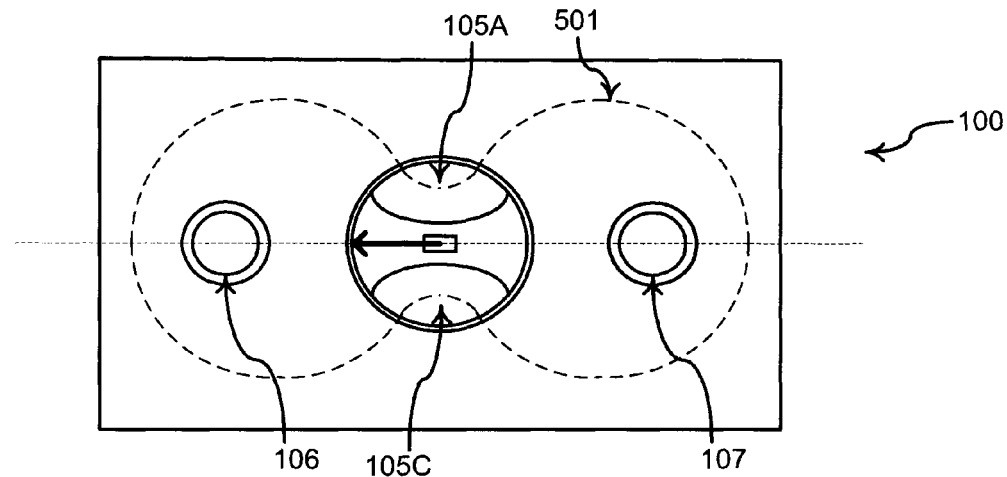
FIG. 5A is an end view of the adjustable EMI suppression core with the inner core in Common Mode Position and an exemplary common mode flux path.
Figure 5B:
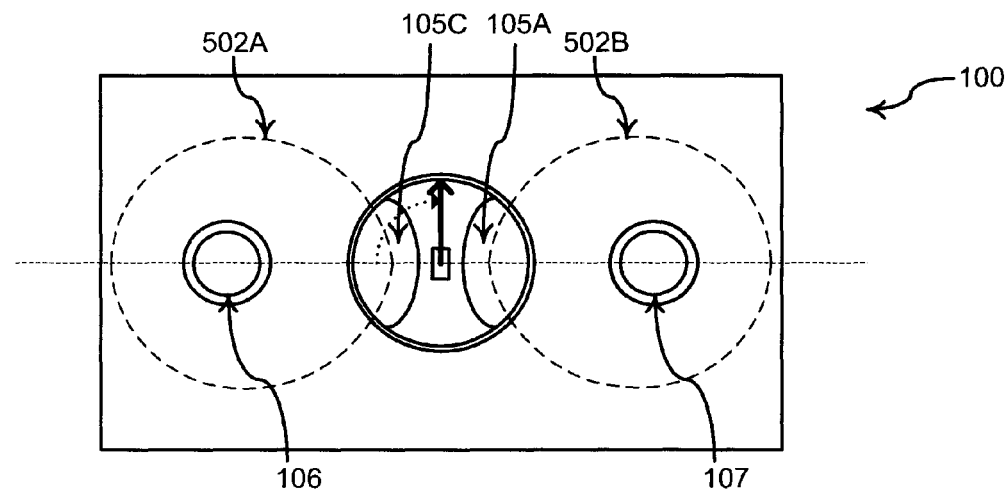
FIG. 5B is an end view of the adjustable EMI suppression core with the inner core in Normal Mode Position and two exemplary normal mode flux paths.

FIG. 5A and FIG. 5B show the respective end views from FIG. 4A and FIG. 4B of adjustable EMI suppression core 100. The Common Mode Position shown in FIG. 5A shows an exemplary common mode flux line 501 which passes through the relatively low reluctance paths provided by inner core sections 105A and 105C. The Normal Mode Position shown in FIG. 5B shows exemplary normal mode flux lines 502A and 502B which pass through the relatively low reluctance paths provided by inner core sections 105A and 105C. As explained earlier, control sensitivity of common mode and normal mode increases as apertures 102 and 104 are made closer to aperture 103. Additionally, control sensitivity increases as height H 405 becomes closer to, or even less than, a diameter of aperture 103.

As shown in FIG. 5A, if a common mode current flows through wires 106 and 107, a relatively low reluctance path around both wires as shown as flux path 501 provides EMI suppression of the common mode currents.

As shown in FIG. 5B, if a normal mode current flows through wires 106 and/or 107, a relatively low reluctance path around each wire as shown as flux paths 502A and 502B provides EMI suppression of the normal mode currents.

Figure 6:
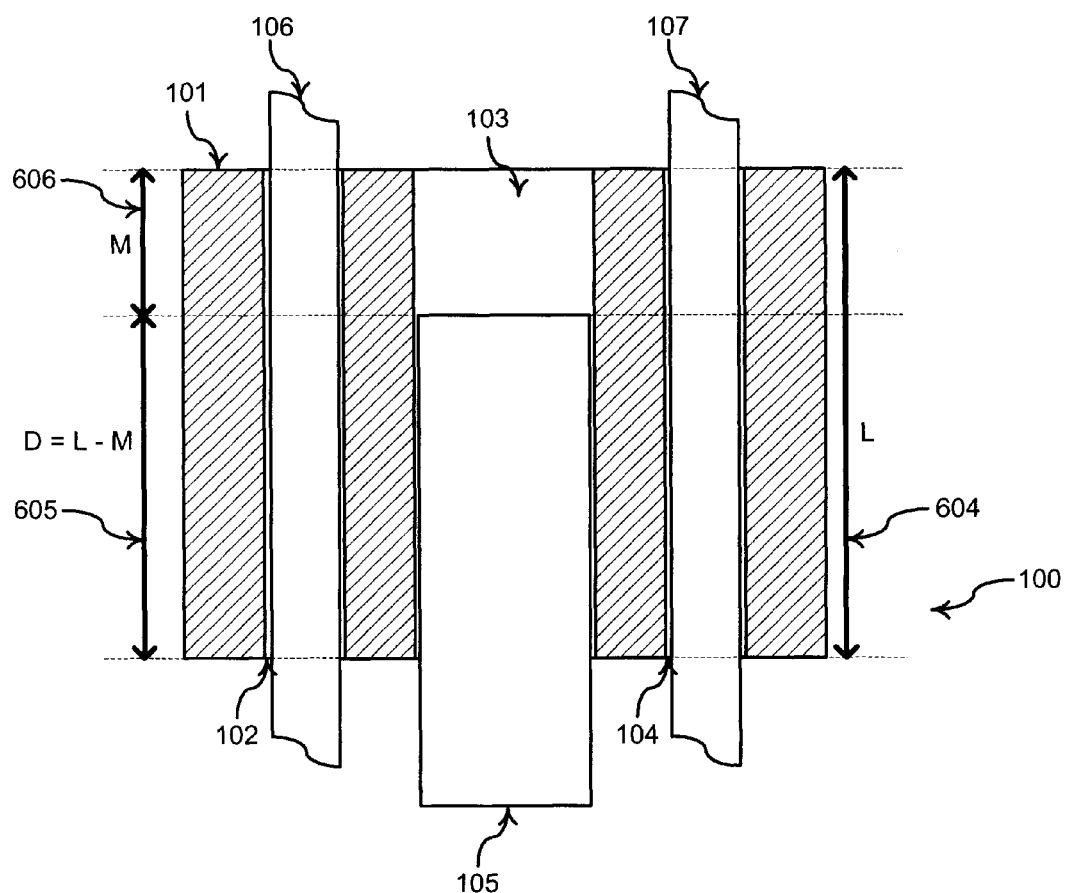
FIG. 6 is a top cross-sectional view of the adjustable EMI suppression core.

A top-view cross-section of adjustable EMI suppression core 100 is shown in FIG. 6. A length L 604 of the outer core 101 is shown. An empty distance M 606 remaining in aperture 103 from inner core 105 is also shown. A distance D 605 within aperture 103 that contains inner core 105 is represented by distance L 604 minus distance M 606.

Figure 7A:
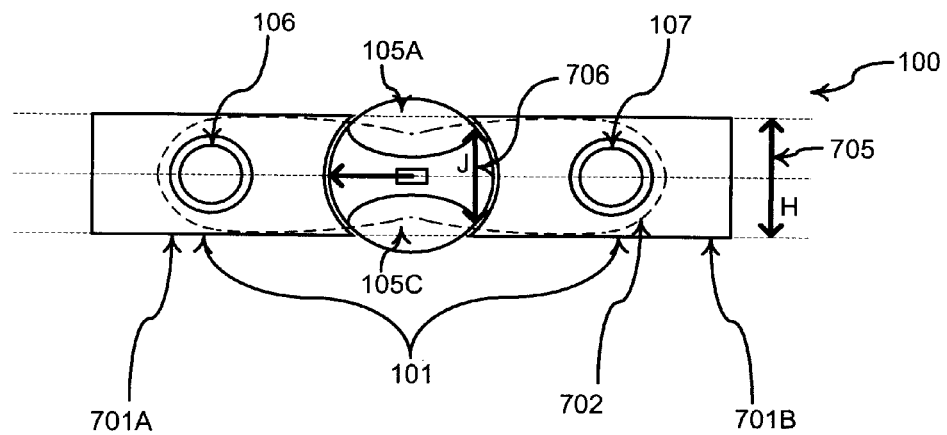
FIG. 7A is an end view of the adjustable EMI suppression core with the height of the outer core reduced to less than the diameter of the inner core. The inner core is shown in the Common Mode Position and an exemplary common mode flux path is also displayed.
Figure 7B:
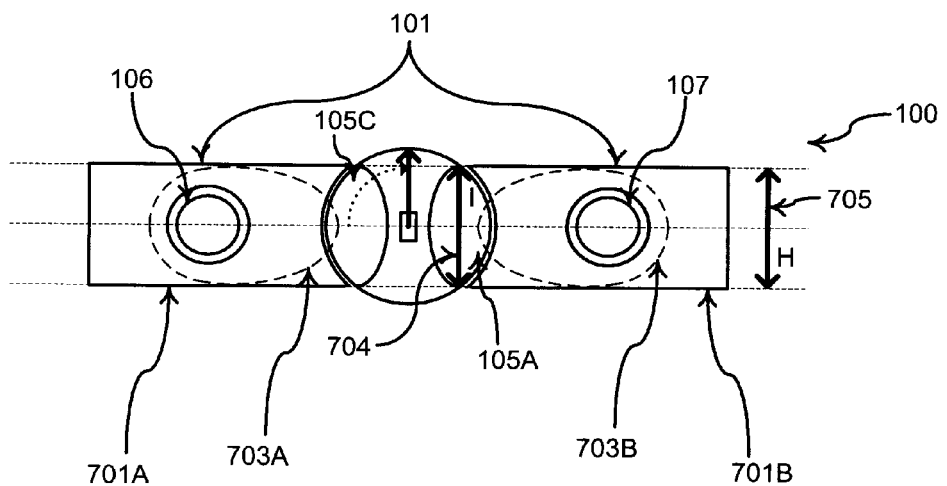
FIG. 7B is an end view of the adjustable EMI suppression core with the height of the outer core reduced to less than the diameter of the inner core. The inner core is shown in the Normal Mode Position and a set of exemplary normal mode flux paths is also displayed.

FIGS. 7A and 7B show an end view of adjustable EMI suppression core 100 wherein outer core 101 has a shorter height than depicted in FIGS. 4A and 4B. The height of inner core sections 105A and 105C shown as I 704. The Common Mode Position is shown in FIG. 7A. The Normal Mode Position is shown in FIG. 7B. In these two figures outer core 101 comprises two pieces, 701A and 701B. The height H 705 of outer core 101 in this embodiment equals I 704. When H 705 equals I 704, there is no low reluctance material in outer core 101 for flux paths to go around both wires 106 and 107 in the Normal Mode Position thereby providing very small common mode EMI suppression. The relative position of the normal mode flux paths 703A and 703B are shown in FIG. 7B. There will be common mode flux paths through the air outside of the adjustable EMI suppression core 100 but they are small because air has high reluctance compared to the first and second reluctances.

In FIG. 7A, the distance J 706 between the ends of inner core section 105A and inner core section 105C is shown. In the Common Mode Position of FIG. 7A, for common mode flux paths 702 to pass through the lower reluctance material in the inner core section 105A and 105C, J 706 needs to be less than H 705.

Figure 8:
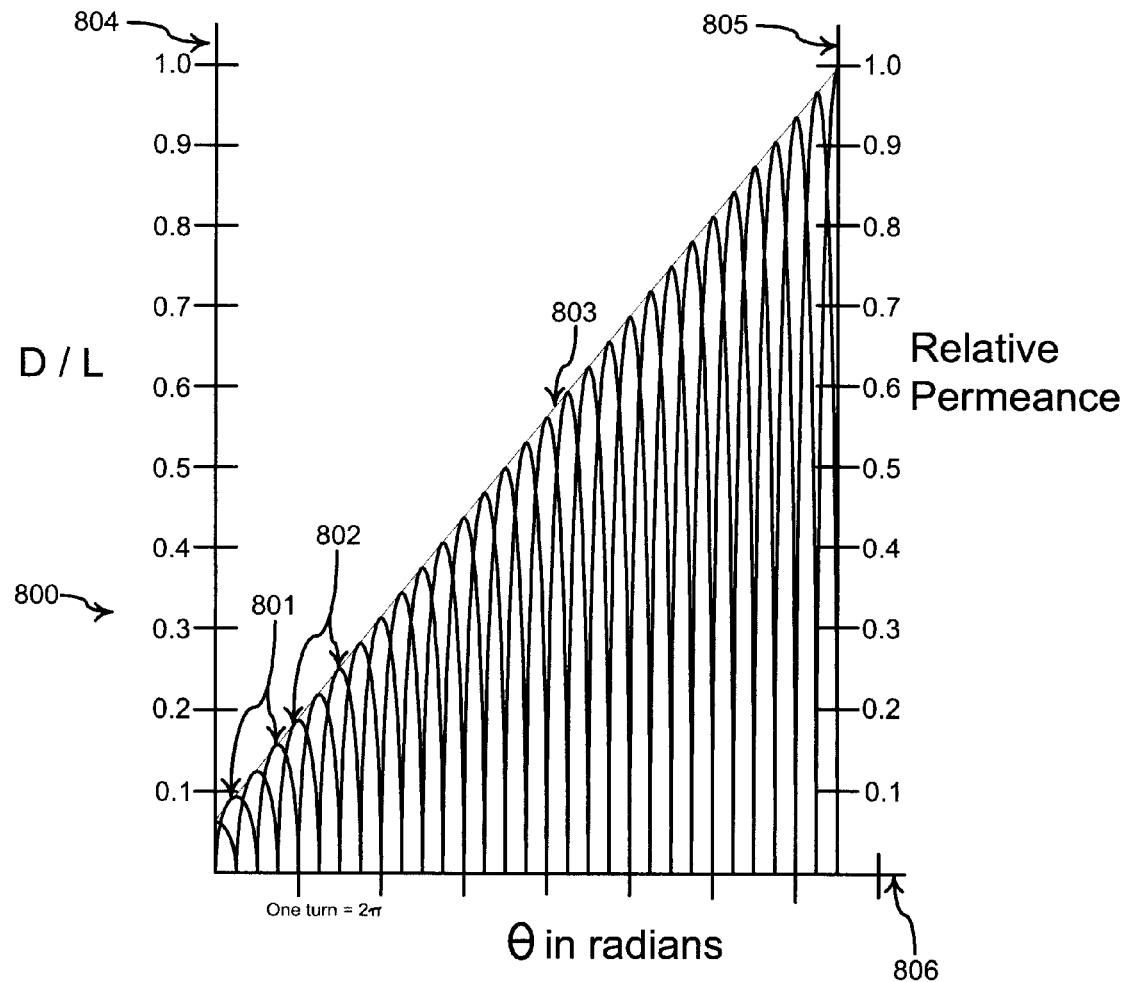
FIG. 8 shows a graph of increasing permeance in common mode and normal mode paths as the inner core becomes more deeply rotatably engaged within the outer core.

FIG. 8 shows a graph 800 of permeance versus distance D 605 (FIG. 6) into outer core 101 versus degree of turn in radians of inner core 105. Permeance is the inverse of reluctance. Line 801 represents the permeance in normal mode. Line 802 represents the permeance in common mode. Line 801 representing normal mode permeance and line 802 representing common mode permeance are ninety degrees out of phase and increase in amplitude as inner core 105 is further inserted into aperture 103. Trend line 803 shows the increase in permeance with increasing degrees of turn. The slope of trend line 803 is dependant on the pitch of threads 301 (FIG. 3). It should be understood that at zero turns there is non-zero common mode permeance and non-zero normal mode permeance. There will always be a non-zero amount of normal mode permeance within the outer core material around wire 106 and wire 107. There will always be a non-zero amount of common mode permeance around both wires 106 and 107. As normal mode permeance and common mode permeance increase, it is relative to when inner core 105 is not inserted into aperture 103, i.e. zero turns. Axis 804 represents the ratio of distance D 605 divided by length L 604. Axis 805 represents the ratio of permeance versus the maximum permeance achievable when inner core 105 is fully engaged in aperture 103, i.e. when distance D 605 divided by length L 604 equals 1. Axis 806 represents the amount of rotation of inner core 105 in radians. The number of turns for D to equal L is dependant on the pitch of threads 301 (FIG. 3).

What is claimed is:

1. An adjustable EMI suppression core comprising:
    an outer core having a first reluctance and further comprising a first circular aperture, a second circular aperture, and a third circular aperture arranged in sequence;
    said first and third apertures having equal diameters and being dimensioned to pass respective wires therethrough;
    said first and third apertures disposed at a distance from a nearest point of the second aperture, said distance less than the diameters of the first and third apertures;
    an inner core being rotatably engagable within said second aperture, said inner core and said second aperture having mating threads;
    a plastic case enclosing said outer core and said inner core;
    said inner core further comprising a first section having a second reluctance having a value not more than two times the first reluctance, a second section having a third reluctance at least five times the first reluctance, and a third section having said second reluctance;
    wherein a normal mode permeance peak and a common mode permanence peak are ninety degrees out of phase with each other when the inner core is rotated within the second aperture; and
    wherein, for each 180° rotation of the inner core within the second aperture, the normal mode permeance and common mode permeance peaks are greater than the respective normal mode permeance and common mode permeance peaks 180° previous.

2. The adjustable EMI suppression core of claim 1, wherein the second reluctance is equal to or less than the first reluctance.

3. The adjustable EMI suppression core of claim 1, wherein the outer core comprises a first outer core portion and a second outer core portion; and wherein the first outer core portion and the second outer core portion are configured to be mechanically separated and subsequently mechanically held together.

4. The adjustable EMI suppression core of claim 1, wherein the inner core further comprises a tool adapter suitable for use by a tool to rotate the inner core within the outer core.

5. The adjustable EMI suppression core of claim 1, wherein the tool adapter is a key slot in an end of said inner core.

6. The adjustable EMI suppression core of claim 1, wherein the outer core has a height less than a diameter of said second aperture.

7. A method for implementing an adjustable EMI suppression core comprising:
    providing an outer core having a first reluctance and further comprising a first circular aperture, a circular second aperture, and a third circular aperture arranged horizontally in sequence;
    providing said first and third apertures to have equal diameters and being dimensioned to pass respective wires therethrough;
    providing said first and third apertures disposed at a distance from a nearest point of the second aperture, said distance less than the diameters of the first and third apertures;
    providing an inner core being rotatably engageable within said second aperture, said inner core and said second aperture having mating threads;
    providing said inner core further comprising a first section having a second reluctance having a value not more than two times the first reluctance, a second section having a third reluctance at least five times the first reluctance, and a third section having said second reluctance,
    wherein a normal mode permeance peak and a common mode permanence peak are ninety degrees out of phase with each other when the inner core is rotated within the second aperture; and
    wherein, for each 180° rotation of the inner core within the second aperture, the normal mode permeance and common mode permeance peaks are greater than the respective normal mode permeance and common mode permeance peaks 180° previous.

8. The method for implementing an adjustable EMI suppression core of claim 7, wherein the second reluctance is equal to or less than the first reluctance.

9. The method for implementing an adjustable EMI suppression core of claim 7, wherein the outer core comprises a first outer core portion and a second outer core portion; and wherein the first outer core portion and the second outer core portion are configured to be mechanically separated and later mechanically held together.

10. The method for implementing an adjustable EMI suppression core of claim 7, wherein the inner core further comprises a tool adapter suitable for use by a tool to rotate the inner core within the outer core.

11. The method for implementing an adjustable EMI suppression core of claim 10, wherein the tool adapter is a key slot in an end of said inner core.

12. The method for implementing an adjustable EMI suppression core of claim 7, wherein the outer core has a height less than the diameter of said second aperture.

\* \* \* \* \*